United States Patent [19]

Lesk et al.

[11] Patent Number: 4,916,082

[45] Date of Patent: Apr. 10, 1990

[54] METHOD OF PREVENTING DIELECTRIC DEGRADATION OR RUPTURE

[75] Inventors: Israel A. Lesk; Clarence A. Lund, both of Phoenix; Thomas C. Smith, Scottsdale, all of Ariz.

[73] Assignee: Motorola Inc., Schaumburg, Ill.

[21] Appl. No.: 322,945

[22] Filed: Mar. 14, 1989

[51] Int. Cl.$^4$ .......................................... H01L 21/268
[52] U.S. Cl. ........................................ 437/20; 437/43; 437/173; 437/228; 437/923; 156/643
[58] Field of Search .................. 437/20, 43, 173, 174, 437/923, 52, 228; 156/643, 646

[56] References Cited

U.S. PATENT DOCUMENTS 4,004,159   1/1977   Rai et al. .................. 437/43
4,822,748   4/1989   Janesick et al. ........... 437/3

FOREIGN PATENT DOCUMENTS 56-93331   7/1981   Japan ...................... 437/43
60-213034  10/1985  Japan ..................... 437/923
2065973    7/1981   United Kingdom ........... 437/173

*Primary Examiner*—Olik Chaudhuri
*Attorney, Agent, or Firm*—Joe E. Barbee

[57] ABSTRACT

Charge on a floating gate of a semiconductor device structure is neutralized by illuminating the structure with a high intensity light during process steps that inject charge. The light provides for the formation of electrons, or free carriers, in the semiconductor substrate. The electrons facilitate tunneling which prevents dielectric degradation or rupture.

12 Claims, 4 Drawing Sheets

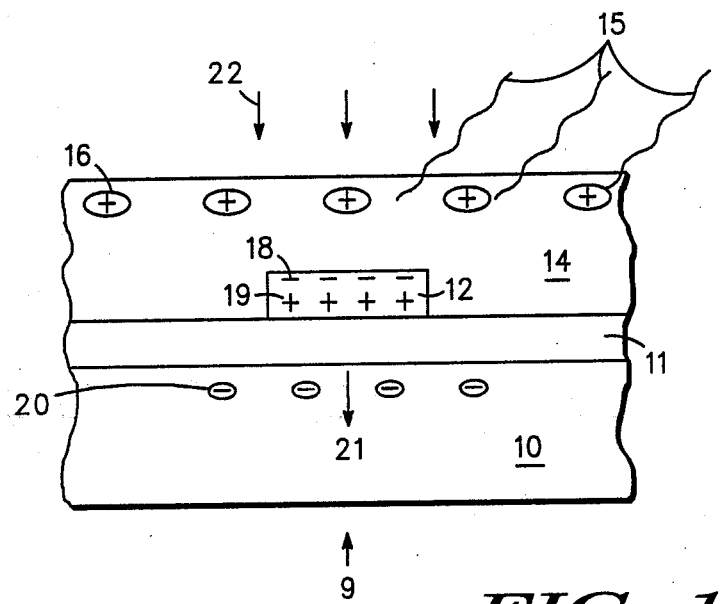
*FIG. 1*
*FIG. 2*
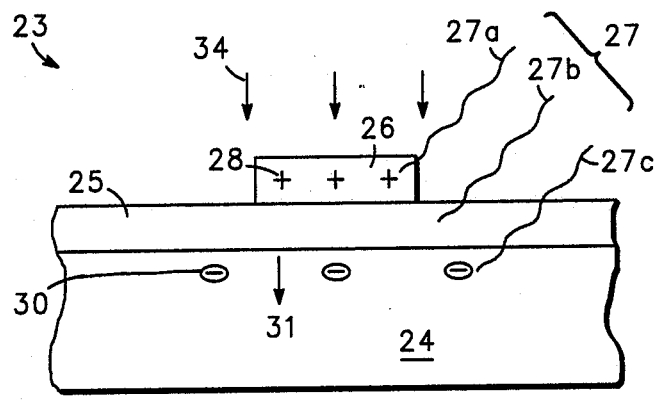

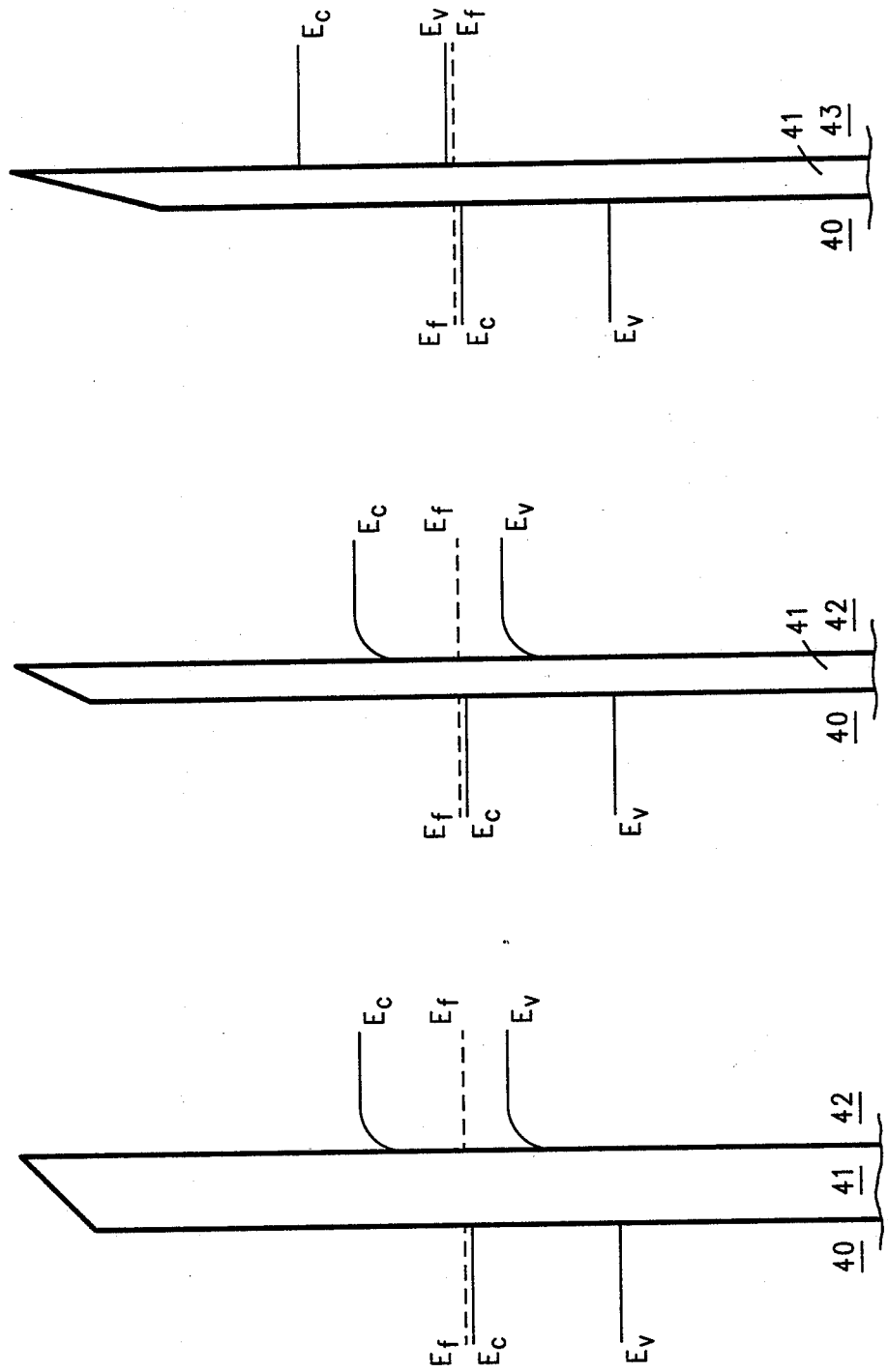

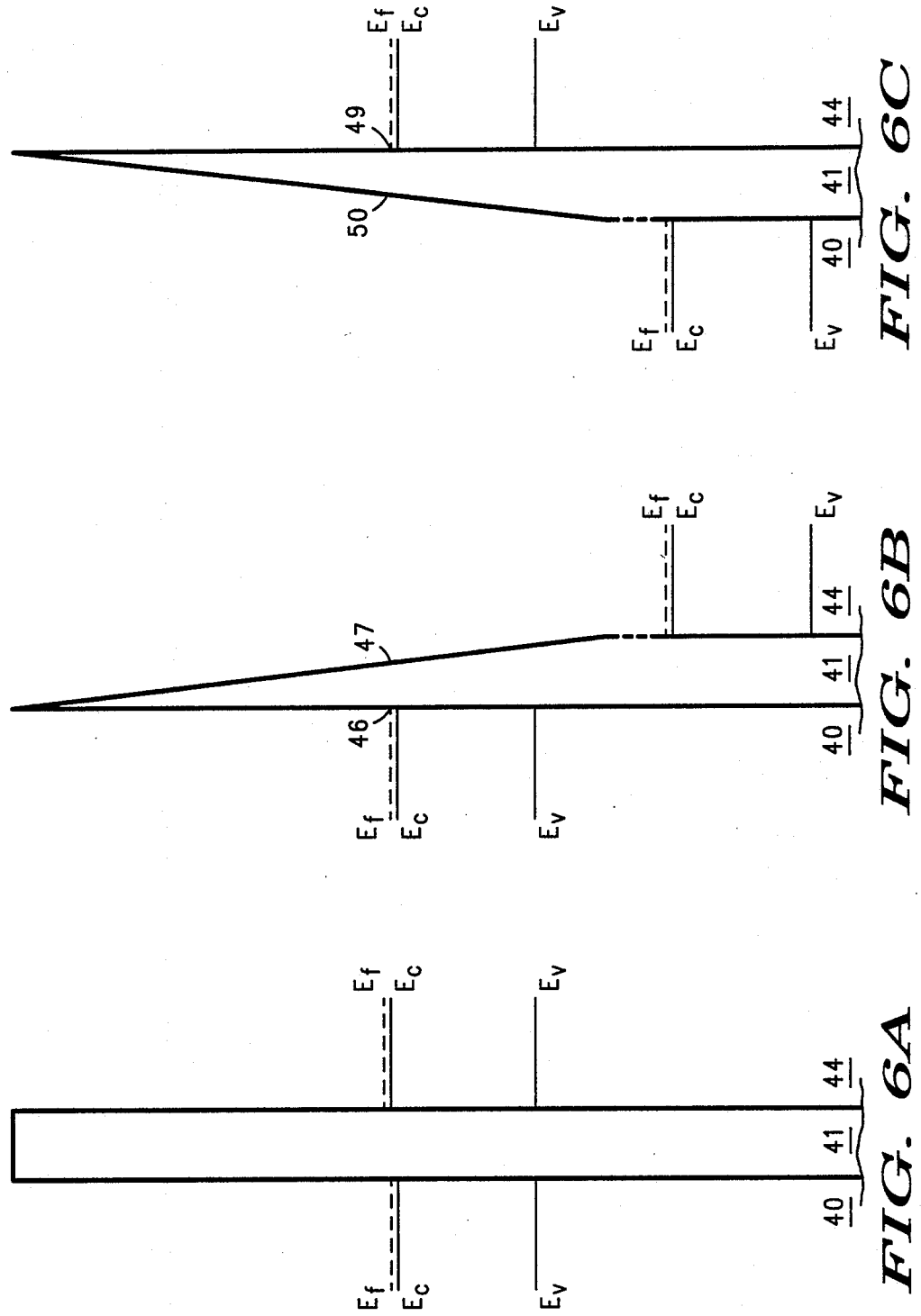

METHOD OF PREVENTING DIELECTRIC DEGRADATION OR RUPTURE

BACKGROUND OF THE INVENTION

This invention relates, in general, to semiconductor device processing, and more particularly, to a method of preventing the degradation of dielectric integrity.

Dielectric rupture can occur when charge is injected into a semiconductor device structure comprising, a semiconductor substrate, a dielectric layer on the substrate and a floating semiconductor (or metal) layer on the dielectric layer. Because the semiconductor layer is floating its charge can not be easily discharged. Processes such as plasma etching, reactive ion etching (RIE), or other dry etching, and ion implantation can inject charge into a semiconductor device structure. If the charge gets large enough to induce high electric fields, the dielectric layer may rupture. This rupture can occur by hot electron damage. Rupture of a gate dielectric causes a degradation in the voltage/current characteristics of a semiconductor device.

A way to lower floating gate charge and reduce the severity of dielectric rupture during ion implantation, is to flood the wafer surface with electrons to neutralize the positive charge deposited onto the surface. This reduces the charging, but does not eliminate it because the flooding cannot be easily controlled for exact compensation. Also, flooding will tend to be over a large area and can result in a net negative gate charge which can also contribute to dielectric rupture. Even if electron flooding could neutralize the positive ions, secondary electrons would result in a net positive charge. In some ion implantation machines, electrons are mixed with the beam to partially neutralize it.

Another method proposed by J. C. Cheng, G. R. Tripp, J. A. Glaze, and J. R. Golin in a paper entitled, "Instrumentation for Neutralization of Wafer Charging," published in Nuclear Instruments and Methods in Physics Research B6 (1985), pp. 243–249, uses photon radiation (UV and X-ray) to increase the conductivity of the dielectric material to provide for charge neutralization. This method has two limitations: (1) when the photon radiation is used in the pulse mode, the power density (W/cm$^2$) is limited by degradation of masking patterns on the wafer surface; (2) in the "dc" illumination mode, the oxide radiation damage limit may be reached. Another disadvantage is that UV and X-ray light are difficult to use.

By now it should be appreciated that it would be advantageous to provide a method of neutralizing the charge injected into MOS semiconductor device structures in order to prevent dielectric rupture.

Accordingly, it is an object of the present invention to provide a method for producing a large rate of free carriers, or electrons, in the semiconductor substrate to permit tunneling and eliminate bulk avalanche.

Another object of the present invention is to provide a method of reducing dielectric rupture.

A further object of the present invention is to neutralize the induced charge from plasma or ion implantation processing.

Yet another object of the present invention is to prevent hot electron damage of the substrate/dielectric interface during energetic ion beam processing.

SUMMARY OF THE INVENTION

In accordance with the present invention, the above and other objects and advantages are provided by shining a high intensity light on a semiconductor wafer during processes in which charge is injected into a floating gate structure. The light provides for the copious production of electrons, or free carriers, in the semiconductor material. Electrons tunneling from the substrate neutralize the charge and thus prevent dielectric rupture and damage to the dielectric/semiconductor interface. The improvement in dielectric integrity allows for the improvement of electrical characteristics of an MOS semiconductor device.

BRIEF DESCRIPTION OF THE DRAWINGS

FIG. 1 illustrates an enlarged cross-sectioned view of a portion of a semiconductor device structure where the present invention would be useful; and FIG. 2 illustrates an enlarged cross-sectional view of a portion of a second semiconductor device structure where the present invention would be useful.

FIGS. 3–9 shows MOS band diagrams useful in explaining how this invention operates.

Figure 9:
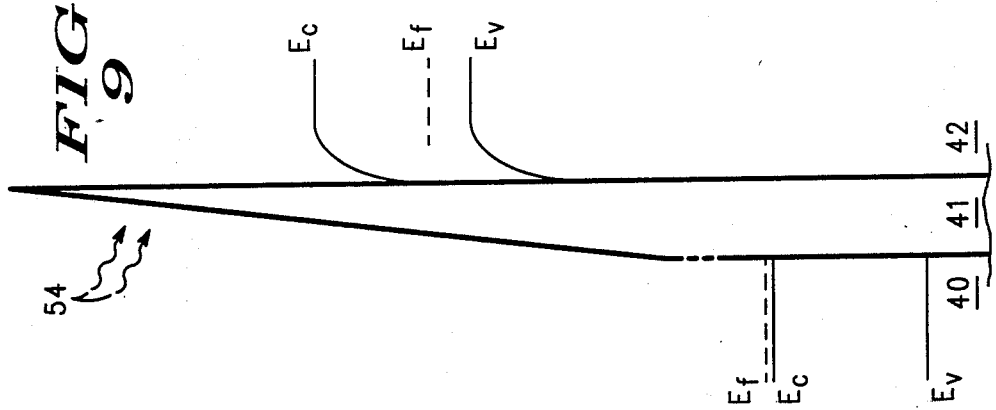

The preferred embodiments of the invention are illustrated for purposes of exemplification, and are not to be construed as limiting in any manner.

DETAILED DESCRIPTION OF THE DRAWINGS

FIG. 1 illustrates a situation where the present invention would be useful. An enlarged cross-sectional view of a portion of semiconductor wafer 9 having a portion of a semiconductor device structure built thereon. What is shown is a semiconductor substrate 10, P type in this illustration, with a dielectric layer 11 disposed thereon. Dielectric layer 11 can be silicon dioxide, silicon nitride, polyimide, or the like. In this embodiment a gate dielectric 11 made of silicon dioxide is shown. A floating semiconductor or conductor region 12 is disposed on dielectric layer 11. In this embodiment, region 12 is preferably a polysilicon gate region. Also illustrated is a photoresist layer 14 disposed on polysilicon 12 and dielectric layer 11. Photoresist layer 14 acts to mask certain regions of a device from ion implantation, etch or other processing. Charge is injected into the structure when subjected to some processing steps such as plasma etching, and ion implantation. For example, when the structure is implanted, as illustrated by an ion implant beam 15, the net result of the ion implantation is a layer of fixed positive charge 16 formed in photoresist layer 14, a layer of mobile negative charge 18 and a layer of mobile or fixed positive charge 19 in polysilicon layer 12, and a layer of fixed negative charge 20 in substrate 10. If the upper portion of photoresist layer 14 is sufficiently damaged or charred by the ion implantation beam 15 to give photoresist 14 sufficient conductivity, flooding electrons (not shown) can flow along the surface and into photoresist 14 to neutralize positive charge 16. If the charge in photoresist layer 14 gets large enough, photoresist layer 14 will rupture due to the electric field induced in photoresist layer 14. This should not be catastrophic because the insulating properties of photoresist 14 prevent the gathering of a large amount of surface charge to feed the rupture. What may be catastrophic is an electric field 21 which forms in substrate 10. Electric field 21 is formed in a direction to promote impinging of hot electrons produced in electric field 21 in semiconductor substrate 10 to the interface of substrate 10 and silicon dioxide 11. By tunneling, the flow of electrons can keep the potential on gate region 12 from getting large enough to cause rupture of silicon dioxide 11. However, if there are not enough electrons in substrate 10 to carry the requisite (Fowler-Nordheim) tunneling current, electric field 21 in silicon substrate 10 can increase enough to cause bulk avalanche and produce hot electron damage at the interface of substrate 10 and dielectric layer 11. The present invention proposes flooding wafer 9 with a high intensity light 22 at the same time charge is injected during a wafer processing step such as ion implantation. The photons of light 22 provide for a large rate of free carrier (electron) production in substrate 10 to allow for tunneling and to eliminate bulk avalanche. For a typical ion implantation process, the current of ion implant beam 15 will be approximately 5 mA for a low current implanter, and approximately 5-20 mA for a high current implanter. The high current implanter will thus inject charge more rapidly into photoresist layer 14, and thus induce charge more rapidly into substrate 10. For example, to neutralize a 1 mA/cm$^2$ of beam current, high intensity light 22 having a power flux of at least approximately 2.5 mW/cm$^2$ would be required. Typically, light 22 having a power flux of approximately 2 to 50 mW/cm$^2$ is desirable to neutralize a charge. In ion implantation processes, it is preferable that light 22 be focused with ion implantation beam 15 to obtain the greatest amount of charge neutralization. However, in dry etching, such as Reactive Ion Etching, a high intensity light 22 is preferably focused on entire wafer 9.

FIG. 2 illustrates another structure where the present invention may be utilized. Illustrated is a structure similar to that shown in FIG. 1, but without a photoresist layer. Shown is an enlarged cross-sectional view of a portion of a wafer 23 having a portion of a semiconductor device structure built thereon. The semiconductor device structure is comprised of a P type semiconductor substrate 24, a gate dielectric layer 25, and a polysilicon or metal gate region 26. When ions 27, following path 27a are implanted in this structure 23, charge is deposited into gate region 25 giving it a net positive charge 28. A layer of fixed negative charge 30 is also formed by depletion of the substrate. Ions 27 following path 27b will damage gate oxide 25 near the edges of gate polysilicon 26. Ions 27 following path 27c damage the interface of substrate 24 and dielectric 25. In this case ion implantation beam 27 also charges gate region 26, and bulk avalanche will occur. Thus, shining a light on wafer 23, illustrated by arrows 34, will prevent high electric fields 31 from forming in substrate 24 and prevent catastrophic rupture in dielectric layer 25. The damage to substrate 24 and dielectric 25 caused directly from ions 27, following paths 27c and 27b can not be prevented by shining a light 34 on the substrate, however, the damage can be annealed out in further high temperature processing.

The effects described above can be described better with reference to the band diagrams in FIGS. 3-9. FIG. 3 illustrates an energy-band diagram, with electron energy plotted vertically, of a structure with a P type substrate 42 having a thick dielectric layer 41 (greater than or approximately equal to 30 angstroms) deposited on substrate 42, and a floating N+ gate region 40 deposited on dielectric layer 41. Region 40 and 42 each have a conduction band $E_c$, a valence band $E_v$, and a fermi level $E_f$. Electrons (not illustrated) in N+ gate region 40 are blocked from entering P type substrate 42 by dielectric layer 41 since electrons cannot easily surmount the high substrate 42/dielectric layer 41 barrier. FIG. 3 represents structures 9 and 23 illustrated in FIG. 1 and FIG. 2, respectively.

In FIG. 4 we have a situation similar to that of FIG. 3 except that dielectric layer 41 is now less than 30 angstroms. Electrons in the conduction band $E_c$ of N+ gate region 40 are copious, and can penetrate thin dielectric layer 41 by equi-energy quantum-mechanical tunneling. However, there is no place for them to tunnel to (horizontally on the diagram, e.g. equi-energy) because they face the forbidden bandgap region, the region between $E_c$ and $E_v$ of P type substrate 42.

FIG. 5 shows an N+ region 40 and P+ type substrate 43 separated by a thin dielectric layer 41. Now, there are empty states on each side of dielectric layer 41 at energy levels the same as copious quantities of electrons in substrate 43 at the same energy levels (occupancy at the fermi level $E_f$ of region 43 is 50%). So, for a small bias across thin dielectric layer 41 to upset equilibrium, electrons can quantum-mechanically tunnel across thin dielectric layer 41.

FIGS. 6a-6c illustrate a symmetrical case - N+ semiconductor regions 40 and 44 on both sides of a thick dielectric layer 41. When the N+ region 44 of FIG. 6a is positively biased, as illustrated in FIG. 6b, a high electric field in dielectric layer 41 is indicated by the steep slope of the top of the barrier of dielectric layer 41 (e.g. conduction band of dielectric layer 41). Electrons in the vicinity of fermi level $E_f$ of region 40 can tunnel at the same energy across the narrowed barrier region, from 46 to 47. At 47, electrons encounter a high field in dielectric layer 41 and rapidly drift into conduction band $E_c$ of N+ region 44 which is positively biased. In FIG. 6c, N+ region 40 is positively biased, thus electrons from conduction band $E_c$ of N+ region 44 tunnel to the left, from 49 to 50. Accordingly, if either N+ region 40 or 44 in FIG. 6a were a floating gate and were given a sufficiently large positive charge, electrons would tunnel to it from the opposite N+ region, and tend to neutralize the positive charge and thus reduce the electric field (which is produced by the floating positive charge).

Figure 8:
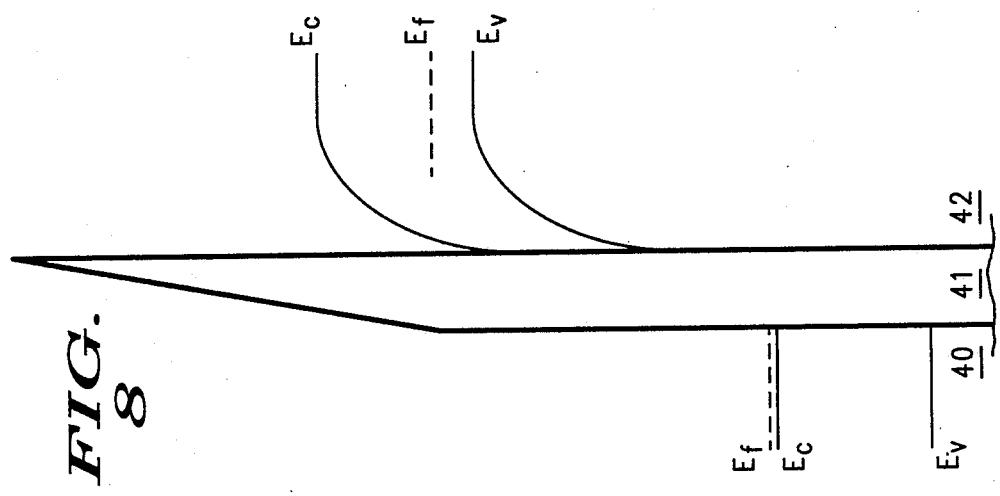
Figure 7:
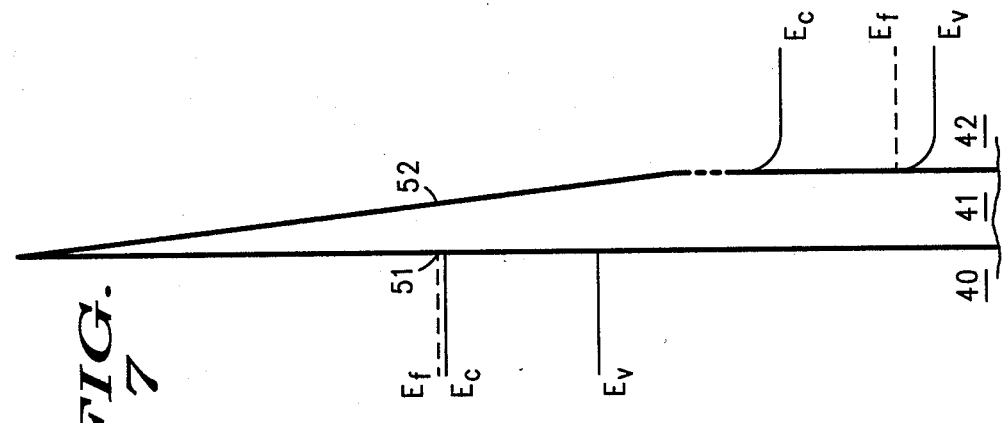

The purpose of this invention is to make the situation of FIG. 3 like that of FIG. 6a, which is basically self-protecting. FIG. 7 shows the diagram of FIG. 3 with a negative charge on floating N+ gate region 40. Electrons can tunnel from 51 to 52, reducing the negative charge buildup on N+ gate region 40 if it gets too high. FIG. 8 shows the diagram of FIG. 3 with a positive charge on N+ floating gate region 40. P type substrate 42 is depleted, and will remain so for a period of time dependent on the generation lifetime in substrate 42 (e.g. longer than the transit time of an ion beam during implantation). The high electric field in substrate 42 generates electron-hole pairs. These hot electrons will impinge on substrate 42/dielectric layer 41 interface and damage it in a way analogous to hot electron damage in a short-channel MOS transistor. With time, dielectric layer 41 is damaged sufficiently that it ruptures, severely damaging the device.

FIG. 9 illustrates the diagram of FIG. 8 with a light 54 illuminated onto the structure. If the structure is illuminated with light 54 of sufficient intensity to eliminate all or most of the depletion region in substrate 42, there will be copious electrons in P type substrate 42 at the interface of dielectric layer 41. Most of the electric field is across dielectric layer 41, analogous to FIG. 6c, so electrons will tunnel to floating N+ gate region 40 and tend to neutralize the positive charge. The tunneling electrons are replaced by new ones generated by light 54 (as hole-electron pairs) so this technique will also be effective even in D.C. ion-impingement situations, such as RIE patterning.

We claim:

1. A method of preventing damage to a dielectric layer, comprising the steps of:
   providing a wafer comprising a semiconductor substrate, the dielectric layer disposed on the substrate, and a floating semiconductor layer disposed on the dielectric layer;
   subjecting the wafer to a process step that injects charge into the wafer; and
   illuminating the wafer with light concurrently with the process step that injects charge into the wafer, wherein the light provides for production of electrons in the substrate which facilitates tunneling of the electrons, and thus prevents damage to the dielectric layer.

2. The method of claim 1 wherein the dielectric layer is a gate dielectric and the floating semiconductor layer is polysilicon.

3. The method of claim 1 wherein the process step that injects charge is an ion implantation step, a plasma-etching step, or a reactive ion etch step.

4. The method of claim 1 wherein the light is a high intensity light having a power flux of approximately 2 to 50 mW/cm$^2$.

5. The method of claim 1 wherein the wafer also comprises a masking layer disposed on the dielectric layer and the floating semiconductor layer.

6. A method of preventing damage to a gate dielectric layer, comprising the steps of:
   providing a wafer comprising a semiconductor substrate, the gate dielectric layer disposed on the substrate, and a floating gate layer disposed on the gate dielectric layer;
   shining a high intensity light on the wafer concurrently with processing the wafer through a process step which injects charge into the wafer, wherein the light produces electrons in the substrate to facilitate tunneling and prevent rupture of the gate dielectric layer.

7. The method of claim 6 wherein the process step that injects charge is an ion implantation step, a plasma-etching step, or a reactive ion etch step.

8. The method of claim 6 wherein the light is a high intensity light having a power flux of approximately 2 to 50 mW/cm$^2$.

9. A method of preventing damage to a dielectric layer, comprising the steps of:
   providing a wafer comprising a semiconductor substrate, the dielectric layer disposed on the substrate, and a floating conductor layer disposed on the dielectric layer;
   subjecting the wafer to a process step that injects charge into the wafer; and
   illuminating the wafer with light concurrently with the process step that injects charge into the wafer, wherein the light provides for production of electrons in the substrate which facilitates tunneling of the electrons, and thus prevents damage to the dielectric layer.

10. The method of claim 9 wherein the dielectric layer is a gate dielectric and the floating conductor layer is metallic.

11. The method of claim 9 wherein the process step that injects charge is an ion implantation step, a plasma-etching step, or a reactive ion etch step.

12. The method of claim 9 wherein the light is a high intensity light having a power flux of approximately 2 to 50 mW/cm$^2$.

* * * * *